United States Patent
Vanden Bossche (10) Patent No.: US 9,651,599 B2
(45) Date of Patent: May 16, 2017

(54) MEASUREMENT SYSTEM FOR CHARACTERISING A DEVICE UNDER TEST

(75) Inventor: Marc Vanden Bossche, Bornem (BE)

(73) Assignee: NATIONAL INSTRUMENTS IRELAND RESOURCES LIMITED, Dublin (IE)

(*) Notice: Subject to any disclaimer, the term of this patent is extended or adjusted under 35 U.S.C. 154(b) by 79 days.

(21) Appl. No.: 14/236,524

(22) PCT Filed: Aug. 7, 2012

(86) PCT No.: PCT/EP2012/065403
§ 371 (c)(1),
(2), (4) Date: Jan. 31, 2014

(87) PCT Pub. No.: WO2013/020969
PCT Pub. Date: Feb. 14, 2013

(65) Prior Publication Data
US 2014/0167793 A1    Jun. 19, 2014

Related U.S. Application Data

(60) Provisional application No. 61/521,059, filed on Aug. 8, 2011.

(51) Int. Cl.
G01R 31/00 (2006.01)
G01R 31/28 (2006.01)
G01R 27/28 (2006.01)

(52) U.S. Cl.
CPC ......... *G01R 31/00* (2013.01); *G01R 31/2839* (2013.01); *G01R 27/28* (2013.01)

(58) Field of Classification Search
CPC ................................ G01R 35/00; G01R 31/00
USPC .................................... 324/537, 750.01, 601
See application file for complete search history.

(56) References Cited

U.S. PATENT DOCUMENTS

| | | | |
|---|---|---|---|
| 7,282,926 B1 | 10/2007 | Verspecht et al. | |
| 7,548,069 B2 | 6/2009 | Simpson | |
| 2007/0194776 A1* | 8/2007 | Bossche | 324/76.22 |
| 2012/0169351 A1* | 7/2012 | Simpson | 324/601 |

\* cited by examiner

*Primary Examiner* — Son Le
*Assistant Examiner* — Zannatul Ferdous
(74) *Attorney, Agent, or Firm* — Meyertons Hood Kivlin Kowert & Goetzel, P.C.; Jeffrey C. Hood (57) ABSTRACT

The present invention relates to a measurement system for characterizing a device under test (DUT) wherein impedance is controlled or varied over a set of measurement conditions and a parameter or a set of parameters measured for each measurement condition. The measurement system comprises
  at least one impedance control device,
  signal separation hardware connected with the impedance control device,
  receiving means for measuring electrical quantities related to characteristics of the DUT and for converting the measured electrical quantities,
  a data processing unit connected to the receiving means and adapted to provide characteristics of the device under test based on the converted electrical quantities,
whereby the at least one impedance control device is integrated into the signal separation hardware.

15 Claims, 10 Drawing Sheets

MEASUREMENT SYSTEM FOR CHARACTERISING A DEVICE UNDER TEST

FIELD OF THE INVENTION

The present invention is related to the field of radio frequency (RE) and microwave measurement technology. More precisely, it relates to the characterization of a device under test (DUT) under different impedance conditions.

BACKGROUND OF THE INVENTION

Impedance control devices, also called tuners, are devices of which the impedance, presented to the outside world, can be changed. This is done by either manually changing a property of the device (e.g. a manual tuner, see e.g. http://www.maurymw.com/MW_RF/Manual_Tuners.php) or by changing a property via an electronic means (e.g. an automated tuner, see http://www.focus-microwaves.com). This device typically has one port or two ports but could in principal have more ports. Via the port these devices are connected to the outside world and provide controllable impedance to the outside world. In most cases, a port is a physical connector through which the impedance control device can be connected to another device. However, the port does not need to be limited to a connector. The port defines a boundary between the impedance control device and the outside world. Amongst others, a port could be a pad of an integrated circuit (IC). The impedance range that the impedance control device can provide depends on the physical properties of the device.

Impedance control devices are well established in source- and load-pull measurement set-ups or measurement systems. These set-ups are used to determine the impedances to be presented at the input and/or output of a device under test in order to optimize one or more of its performance characteristics, e.g. the delivered output power, power added efficiency and other. In this case the device under test is typically a transistor or an amplifier under test. These set-ups are also used to characterize the behaviour of devices, e.g. transistors, diodes, amplifiers, mixers etc. under realistic test conditions or to verify and/or improve their model, used in computer aided engineering tools (CAE).

The impedance control devices, which are presently used in commercially available source- and load-pull systems, are based on different techniques. As measurement means, these source- and load-pull systems use different types of measurement receivers: one or more power meter, spectrum analyzer, network analyzer, oscilloscope, . . . .

First, there are the passive impedance control devices. They are based on one or more moveable resonator or slug. These tuners usually are bulky due to the mechanical aspects, while shrinking in size with increasing frequency due to reduced wavelength. As such they take a lot of space in a measurement set-up. To move the resonator(s) or slug(s) automatically, tuners contain step motors. As these parts are moving to synthesize a new impedance, the tuners can cause vibrations in the measurement set-up. This is typically a problem for on-wafer measurements. The use of pin-diodes, positioned at different positions of transmission line stubs, has been an alternative to synthesize impedances in a passive way. This approach results in smaller form factors, eliminating the step motors, but is presently limited to power levels up to approximately 35-40 dBm. The principle is based on creating reflections on a transmission line at different positions by turning on or off the pin diodes at these positions. As such the size is dependent on the frequency range. Pin diodes can be switched on and off very fast. Consequently impedances can be tuned fast. This type of tuners has never been integrated into other functional modules, like couplers, in spite of the smaller form factor.

Secondly, there are the active tuners with different types of closed loop control. They sense the output power of the DUT, amplify or attenuate it and shift it in phase and re-inject this signal towards the device under test as reflected wave. Meanwhile proper selection in topology and narrowband filtering in the loop minimizes the risk of oscillation. These set-ups usually are also bulky because the couplers, amplifiers, attenuators, filters and phase shifters are connectorized devices. Thirdly, there are the active tuners with open loop control. They actively inject power towards the DUT output in a phase coherent way with the source which provides the input signal to the device under test. This can be realized in different ways, e.g. by splitting the input source, followed by amplifying or attenuating and phase shifting it (as in the presentation "Active and passive load-pull systems: from the basic to the future of variable impedance device characterization", A. Ferrero et al, PAF, pp. 13-14, IMS 2005 Workshop WSG), or by using a second source which is controllable in amplitude and phase and phase locked to the source at the input (see "High power active harmonic load-pull system for characterization of high power 100-watt transistors", Z. Aboush et al., EUMC 2005, Proc. Vol. 1). For both approaches, the signal injected back to the device under test is amplified or attenuated and controlled in phase compared to the signal that comes out of the device under test. In this way synthetically different impedances can be synthesized. A similar approach can be used to synthesize impedances at the input of the device under test, typically at harmonics of the input source. Also this set-up is bulky requiring splitters, possibly a second source, amplifiers, phase control, possibly filters etc. . . . .

Due to the mechanical dimensions of passive tuners and the length of cable and the parts used for the active tuning, there is usually a meaningful signal delay between the plane of the device under test, where one wants to synthesize an impedance, and the place where the actual tuning happens. For broadband modulation signals the impedance at the device under test will not be constant across the modulation bandwidth and will deviate from the impedance synthesized at a given frequency within that band.

The speed of passive tuners, except for the tuners based on pin diodes, is related to the step motors speed and the inertia of the mechanical structure. The active tuners need to track all the time the input signal to maintain the impedance at the output constant.

Due to their precise construction, passive tuners, and as such tuner set-ups, are usually quite expensive. Also active tuners are usually quite expensive due to the required additional hardware.

Figure 1:
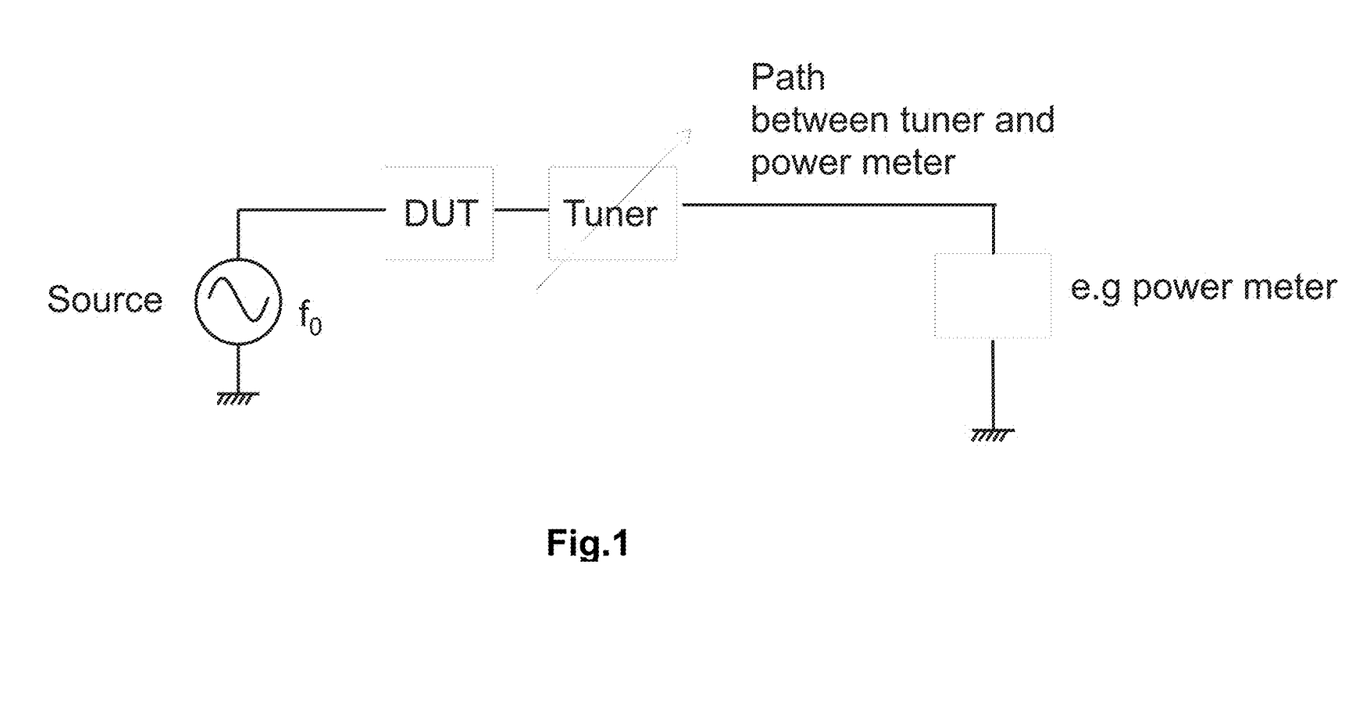
FIG. 1 represents an example of a load-pull measurement set-up.

Commercially available set-ups, provided with an impedance control device, minimally contain a source to stimulate the device under test, the DUT itself, followed by a tuner and a means (e.g. a power meter) to measure the power transmitted by the DUT under different impedance conditions, as illustrated in FIG. 1.

Figure 2:
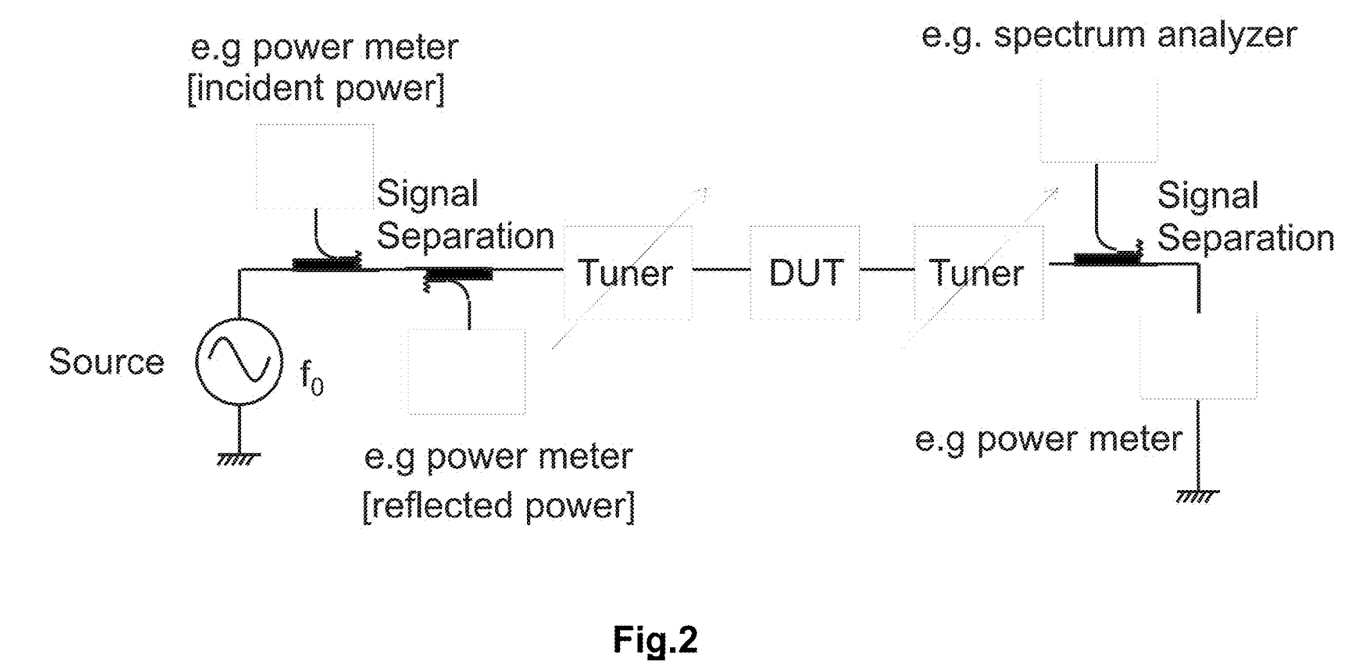
FIG. 2 illustrates an extended set-up for a source- and load-pull system.

Further extended set-ups also use power measurement capability at the input to measure input power, possibly in combination with a source tuner and the capability to measure reflected power at the input, a spectrum analyzer at the output to perform frequency selective power measurements and to monitor stability (FIG. 2).

Figure 3:
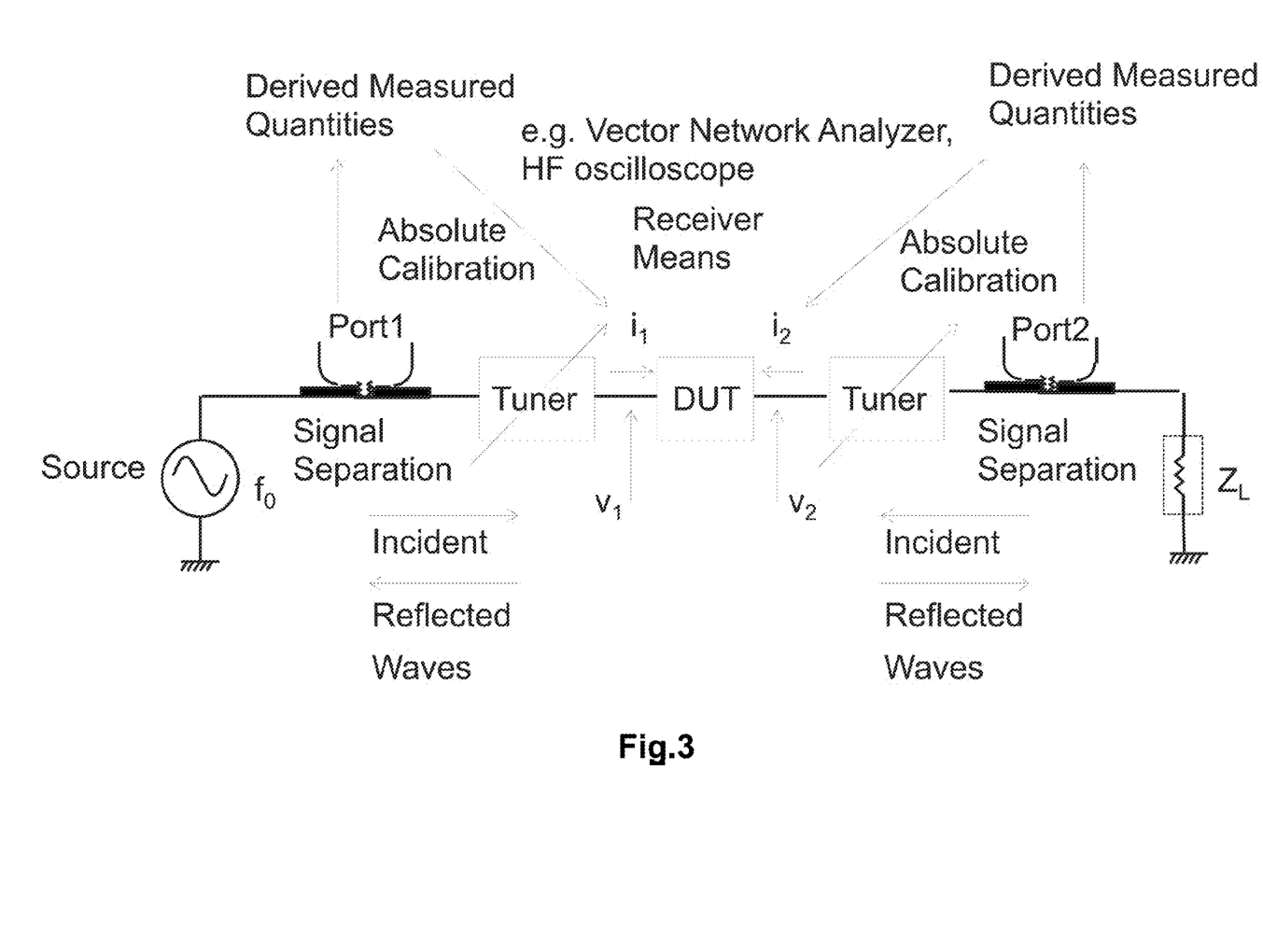
FIG. 3 illustrates an extended set-up for source- and load-pull with time domain capability. The tuners are positioned between the signal separation HW and the DUT.

If one wants to measure more information at the DUT, it is possible to use a vector network analyser, an oscilloscope or a receiver with similar capabilities in combination with signal separation hardware that can detect samples of the incident and reflected waves (or a combination thereof). The selected receivers allow measuring in a frequency selective way a derivate of the incident and reflected waves or the voltage and the current at the ports of the device under test. With the most advanced systems today it is possible to measure both amplitude and phase of the spectral components present in said derivate of the incident and reflected waves (FIG. 3). Thanks to absolute calibration techniques it is possible to relate the derived quantities to the incident and reflected waves or voltage and currents in the calibration plane.

Signal separation should be construed in its broadest sense. In FIG. 1 the signal separation is just a signal path connecting the tuner to the power sensor. In FIG. 2 the signal separation is the hardware that probes one quantity, e.g. an incident or reflected wave or a voltage or a current. The signal separation hardware can also be arranged to probe two signal quantities, e.g. an incident and reflected wave (one bidirectional coupler (as in FIG. 3) or two unidirectional couplers) or voltage and current (voltage and current probes) or a combination thereof. For the signal separation hardware possibly distributed couplers, loop couplers or IV probes are being used. They can be single or dual depending on the number of quantities being measured.

Figure 4:
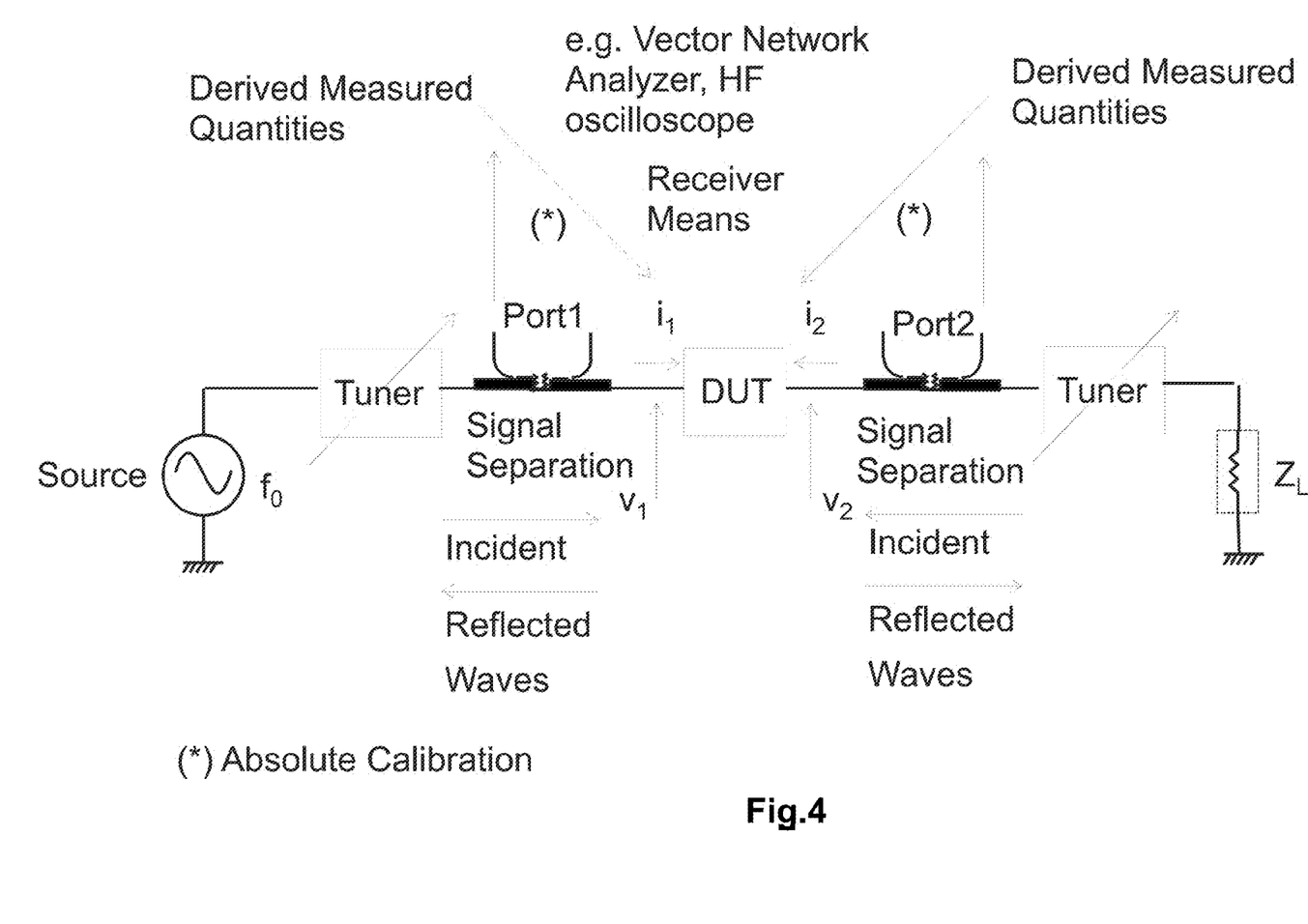
FIG. 4 represents an extended set-up for source- and load-pull with time domain capability. The signal separation HW is positioned between the tuner and the DUT.

In set-ups to measure the incident and reflected waves or a combination thereof, typically in a frequency-selective way, the signal separation hardware can be put (see FIG. 3) outside the combination of device under test and tuner (after the DUT and tuner) or between the DUT and the tuner (FIG. 4). With the first configuration (FIG. 3) one needs to use the S-parameters of the tuner to properly de-embed the measurements up to the device under test as the impedance is being changed. With the second configuration (FIG. 4) the incident and reflected waves or a combination thereof are always measured at the DUT, independently of the tuner position. The accuracy is related to the used calibration technique. Also in case of the synthesis of reflection factors close to the edge of the Smith chart, this approach (FIG. 4) is the only viable approach. In this case, one needs to select signal separation hardware that minimizes the losses between the DUT and the tuner, as the losses do reduce the coverage area of the Smith chart. Due to the advantages of the latter set-up and the need to minimize the losses, signal separation hardware has been integrated into the tuners (see for example U.S. Pat. No. 7,548,069 and U.S. Pat. No. 7,282,926). This is possible thanks to the large size of the impedance control devices.

Presently the passive tuners or impedance control devices are large such that they take meaningful space on a measurement bench and create practical problems to combine with on wafer measurements (e.g. space and vibration during the movement of the mechanical tuner parts). Further, they are also rather heavy and difficult to bring very close to the DUT. Especially on wafer this creates mechanical challenges. It is further to be noted that due to their principle of operation, the dimensions of the passive tuner increase when the frequency of interest lowers. Because of their size, passive tuners are very difficult to integrate with test and measurement instrumentation. As mentioned, also the source- and load-pull systems based on active tuners suffer from their large size and with both approaches it is very difficult to realize impedances, which are enough constant for a broadband modulation.

Hence, there is a need for overcoming these drawbacks.

SUMMARY OF THE INVENTION

It is an object of embodiments of the present invention to provide a measurement system for characterising a device under test in a non-50 Ohm environment wherein the abovementioned problems are avoided or overcome.

The above objective is accomplished by the solution according to the present invention.

In a first aspect the invention relates to a measurement system for characterising a device under test, DUT, wherein impedance is controlled or varied over a set of measurement conditions and a parameter or a set of parameters measured for each measurement condition. The measurement system comprises at least one impedance control device, signal separation hardware connected with the at least one impedance control device, receiving means for measuring electrical quantities related to characteristics of the device under test and for converting the measured electrical quantities, a data processing unit connected to the receiving means and adapted to provide characteristics of the device under test based on the converted electrical quantities, whereby the at least one impedance control device is integrated into the signal separation hardware.

The proposed solution indeed allows for a much more compact set-up than in the prior art measurement systems, due to the integration of the at least one impedance control device into the signal separation hardware. The integration of the small sized impedance control device allows keeping the distance between the impedance control device and the device under test short in comparison with the signal wavelength.

In a preferred embodiment the measurement system comprises a plurality of said impedance control devices, with one or more of the impedance control devices in a single chip package. One impedance control device can be in one chip, but in certain embodiments one can have more impedance control devices in one chip.

Preferably the signal separation hardware and the at least one impedance control device are integrated on a common substrate. In a specific embodiment also the DUT is advantageously integrated on the common substrate.

In another embodiment the measurement system comprises a further data processing unit connected to the at least one impedance control device and arranged to synthesize a given impedance. In an advantageous specific embodiment the further data processing unit is integrated with the at least one impedance control device.

In yet another preferred embodiment the receiving means is integrated with the signal separation hardware.

In an advantageous embodiment said data processing unit adapted to provide characteristics of the DUT is integrated with the signal separation hardware.

In one embodiment the signal separation hardware is a single signal path from the at least one impedance control device to the receiving means.

In yet another embodiment the measurement system further comprises means for tuning impedances, whereby said means for tuning at least comprises a signal source. The means for tuning is advantageously integrated with either the signal separation hardware or with the at least one impedance control device.

In one embodiment the receiver means is a power sensor. The data processing unit is then preferably adapted for acting as a power meter.

The invention further also relates to a vector network analyser comprising a measurement system as previously described.

For purposes of summarizing the invention and the advantages achieved over the prior art, certain objects and advantages of the invention have been described herein above. Of course, it is to be understood that not necessarily all such objects or advantages may be achieved in accordance with any particular embodiment of the invention. Thus, for example, those skilled in the art will recognize that the invention may be embodied or carried out in a manner that achieves or optimizes one advantage or group of advantages as taught herein without necessarily achieving other objects or advantages as may be taught or suggested herein.

The above and other aspects of the invention will be apparent from and elucidated with reference to the embodiment(s) described hereinafter.

BRIEF DESCRIPTION OF THE DRAWINGS

The invention will now be described further, by way of example, with reference to the accompanying drawings, wherein like reference numerals refer to like elements in the various figures.

DETAILED DESCRIPTION OF ILLUSTRATIVE EMBODIMENTS

The present invention will be described with respect to particular embodiments and with reference to certain drawings but the invention is not limited thereto but only by the claims.

Furthermore, the terms first, second and the like in the description and in the claims, are used for distinguishing between similar elements and not necessarily for describing a sequence, either temporally, spatially, in ranking or in any other manner. It is to be understood that the terms so used are interchangeable under appropriate circumstances and that the embodiments of the invention described herein are capable of operation in other sequences than described or illustrated herein.

It is to be noticed that the term "comprising", used in the claims, should not be interpreted as being restricted to the means listed thereafter; it does not exclude other elements or steps. It is thus to be interpreted as specifying the presence of the stated features, integers, steps or components as referred to, but does not preclude the presence or addition of one or more other features, integers, steps or components, or groups thereof. Thus, the scope of the expression "a device comprising means A and B" should not be limited to devices consisting only of components A and B. It means that with respect to the present invention, the only relevant components of the device are A and B.

Reference throughout this specification to "one embodiment" or "an embodiment" means that a particular feature, structure or characteristic described in connection with the embodiment is included in at least one embodiment of the present invention. Thus, appearances of the phrases "in one embodiment" or "in an embodiment" in various places throughout this specification are not necessarily all referring to the same embodiment, but may. Furthermore, the particular features, structures or characteristics may be combined in any suitable manner, as would be apparent to one of ordinary skill in the art from this disclosure, in one or more embodiments.

Similarly it should be appreciated that in the description of exemplary embodiments of the invention, various features of the invention are sometimes grouped together in a single embodiment, figure, or description thereof for the purpose of streamlining the disclosure and aiding in the understanding of one or more of the various inventive aspects. This method of disclosure, however, is not to be interpreted as reflecting an intention that the claimed invention requires more features than are expressly recited in each claim. Rather, as the following claims reflect, inventive aspects lie in less than all features of a single foregoing disclosed embodiment. Thus, the claims following the detailed description are hereby expressly incorporated into this detailed description, with each claim standing on its own as a separate embodiment of this invention.

Furthermore, while some embodiments described herein include some but not other features included in other embodiments, combinations of features of different embodiments are meant to be within the scope of the invention, and form different embodiments, as would be understood by those in the art. For example, in the following claims, any of the claimed embodiments can be used in any combination.

It should be noted that the use of particular terminology when describing certain features or aspects of the invention should not be taken to imply that the terminology is being re-defined herein to be restricted to include any specific characteristics of the features or aspects of the invention with which that terminology is associated.

In the description provided herein, numerous specific details are set forth. However, it is understood that embodiments of the invention may be practiced without these specific details. In other instances, well-known methods, structures and techniques have not been shown in detail in order not to obscure an understanding of this description.

The present invention capitalizes on an observed evolution in electronics and RF electronics in particular. Impedance control devices are now available in chip packages. These devices implement typically variable capacitors based on semiconductor varactors, MEMs technology and CMOS technology. These impedance control devices are aimed mainly at simplifying the design of amplifiers working in conjunction with antennas and more in particular at antenna matching for mobile communications, anticipating the evolution of smart phones for multi-band functionality limiting the number of antennas in the appliance to a minimum (ideally one antenna).

This invention takes advantage of the availability of impedance control devices in chip package and the fact that they are easily combinable with other functionality provided by other chips. These devices are similar in size or smaller than the signal separation hardware or the power detection hardware of a typical source- and load-pull setup. To overcome major drawbacks of present source- and load-pull systems, related to size, speed of impedance tuning and cost of the set-up, embodiments of the present invention integrate one or more chip-based impedance control devices inside the signal separation hardware or the power detection hardware. Hereby drawbacks of present source- and load-pull set-ups are overcome. The proposed solution results for the test engineer in a much more compact set-up and possibly even in a portable source- and load-pull system. The integration can in certain embodiments be achieved on the same substrate.

Because of the small size, the distance between the impedance control devices and the device under test can be kept short, compared to the signal wavelength, and as such there is the potential to synthesize a broadband impedance for modulation applications.

Due to limitations of presently available impedance control devices in chip package, one has to limit presently the practical use to lower power and medium power applications. With the state of the art, it is possible to deal with power levels up to 40 dBm. Also the frequency ranges are limited to the most common modulation protocols, e.g. LTE. As the technology advances, power and frequency ranges can possibly be extended, maintaining the underlying concept of this invention.

Figure 5:
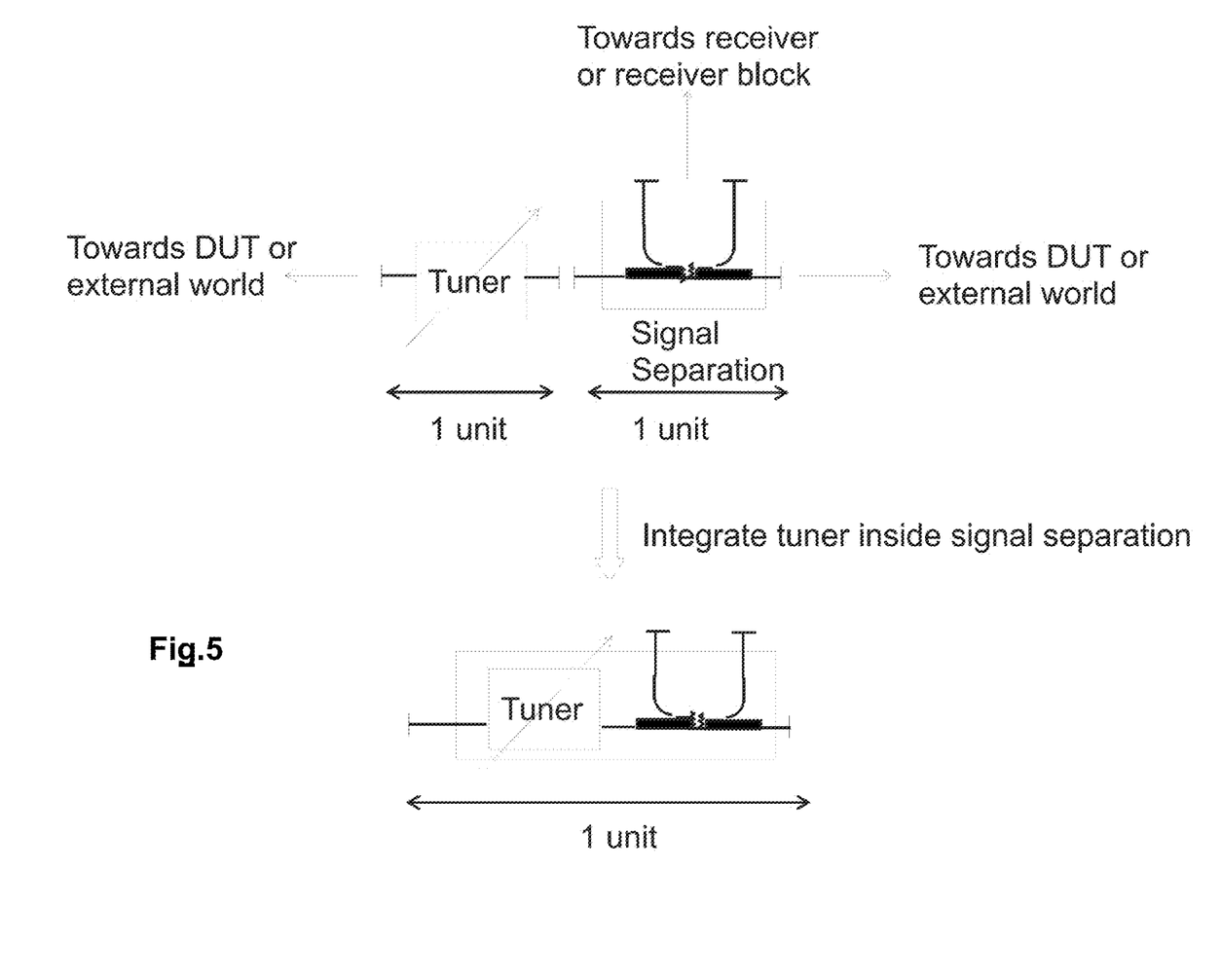
FIG. 5 illustrates the integration of a tuner inside the signal separation hardware according to the present invention.

This invention integrates one or more chip-based impedance control devices inside the signal separation devices, mainly used in source- and load-pull set-ups (FIG. 5). In contrast to the prior art where the signal separation hardware is integrated inside the tuner, an impedance control device or a combination of impedance control devices is integrated inside the signal separation hardware.

Depending on the complexity of the combination of the impedance controlled devices, certain embodiments of the proposed measurement system have topologies to set the impedance simultaneously at different frequencies. Amongst others distributed couplers, loop couplers, wave-probes or VI-probes can be used as signal separation hardware. Depending on the signal separation hardware topology they measure one quantity, e.g. the incident or reflected wave or a voltage or current or one combination of both, or they measure two quantities, e.g. incident and reflected wave or voltage and current or two quantities which are a combination of both.

Figure 6:
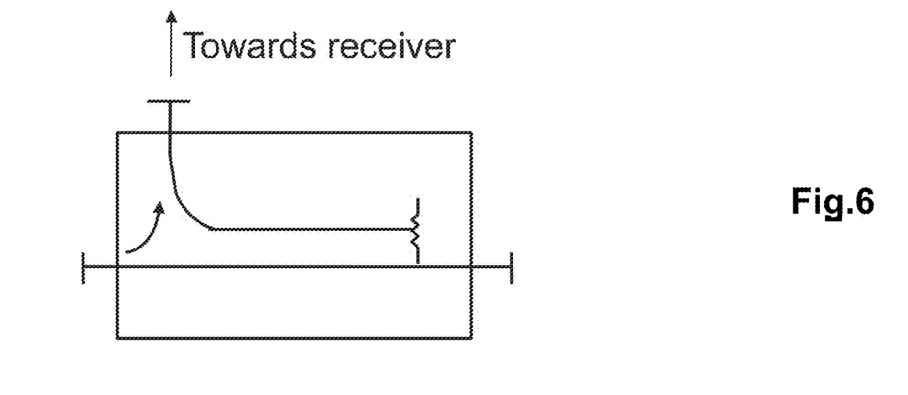
FIG. 6 illustrates a typical unidirectional coupler.
Figure 7:
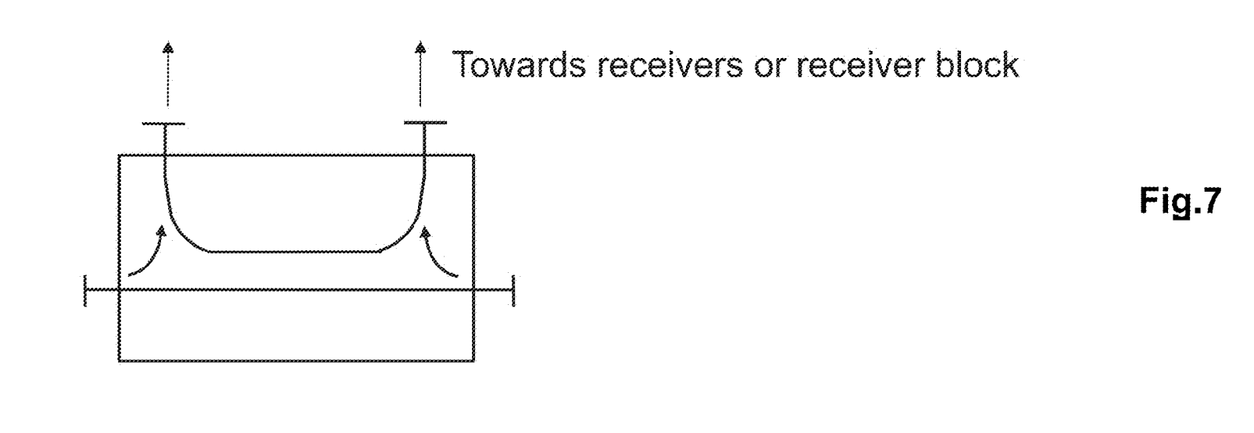
FIG. 7 illustrates a typical bidirectional coupler.

Signal separation devices typically have their own housing with RF input- and output-connector to connect to the device under test at one site and to connect to the outside world at the other site. The latter site can connect for example to a fixed load where the power is dissipated or can connect to a source where power is generated. There is at least one (FIG. 6) or two (FIG. 7) additional connectors depending on the number of quantities that are being measured.

Figure 8:
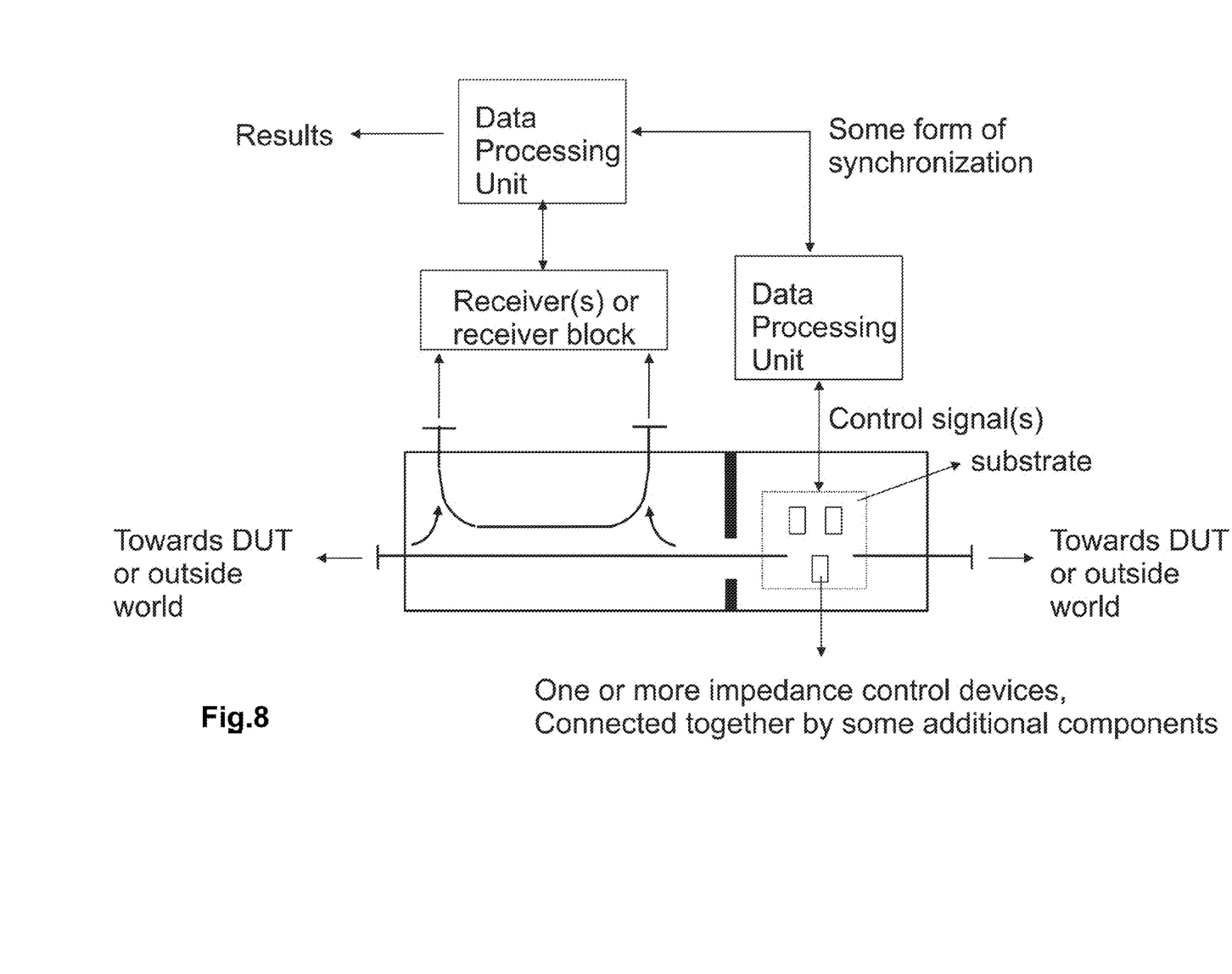
FIG. 8 illustrates a bidirectional coupler extended with chip-based impedance control devices and data processing unit.
Figure 9:
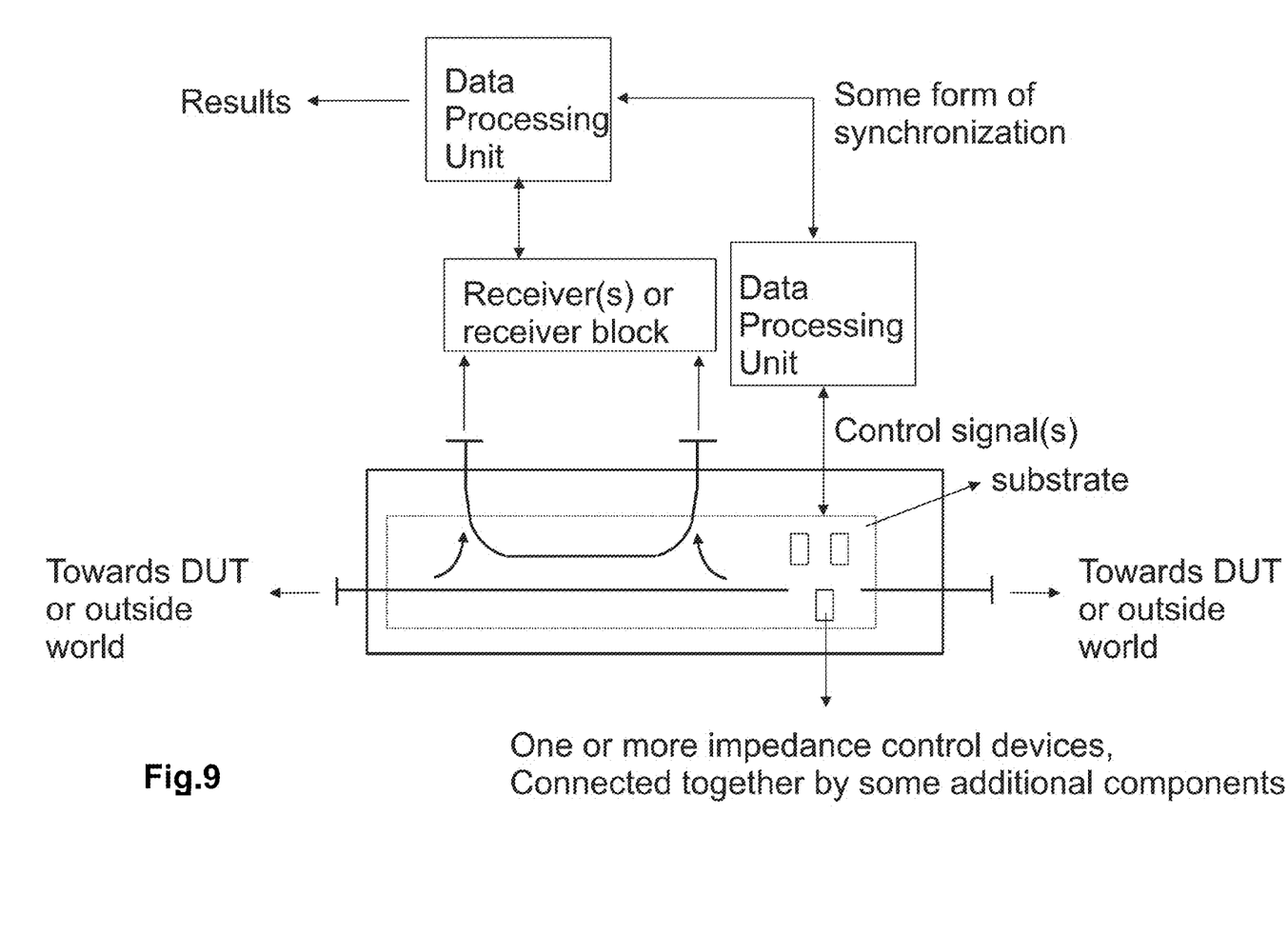
FIG. 9 illustrates a bidirectional coupler extended with chip-based impedance control devices on a common substrate and data processing unit.

According to embodiments of this invention, the housing of the signal separation is extended, possibly with a separate compartment, depending on the technology used for the signal separation hardware, such that the signal separation hardware can be followed by and connected to one or more chip-based impedance control devices (FIG. 8). The device under test could be connected on either side (FIG. 8) but for source- and load-pull applications the best is to connect to the signal separation side. The tuner(s) will be able to synthesize different impedances towards the device under test, depending on the capabilities of the impedance control devices. Possibly the signal separation can be realized on the same substrate, used to mount and connect the impedance control devices (FIG. 9), for example this can be done when the couplers are in microstrip technology. To function properly, the impedance control devices will be combined and connected with some other chips of similar size to implement the necessary impedance tuning capability, e.g. some solid state switches to switch between or some fixed impedances, like inductances.

The set of chips are controlled by some electronic control signals to synthesize the proper impedance. The algorithm or method to synthesize the proper impedance is implemented in a signal or data processing unit (FIG. 8), which controls the control signals. This data processing unit could be integrated with the set of chips on the same or a different substrate in the same housing. The impedance control devices may be provided with an interface to control the state from a processing unit.

Each signal probed by the signal separation hardware goes to one receiver or to a common receiver block to measure and convert the analogue signals to numbers in a data or signal processing unit. This data processing unit could be the same unit as the data processing unit to control the tuners. At least some synchronization between the two units is necessary to make sure that measurements are performed when the tuners are in the proper position. The data processing unit communicates the measurement and/or calculation results with the outside world via the proper means, e.g. a display (FIG. 8).

When chip sizes further shrink, it is imaginable that the whole functionality can be integrated in the signal separation hardware. As such the receiver, data processing unit and/or a display means can be integrated with the signal separation hardware and even with the impedance control devices.

Figure 10:
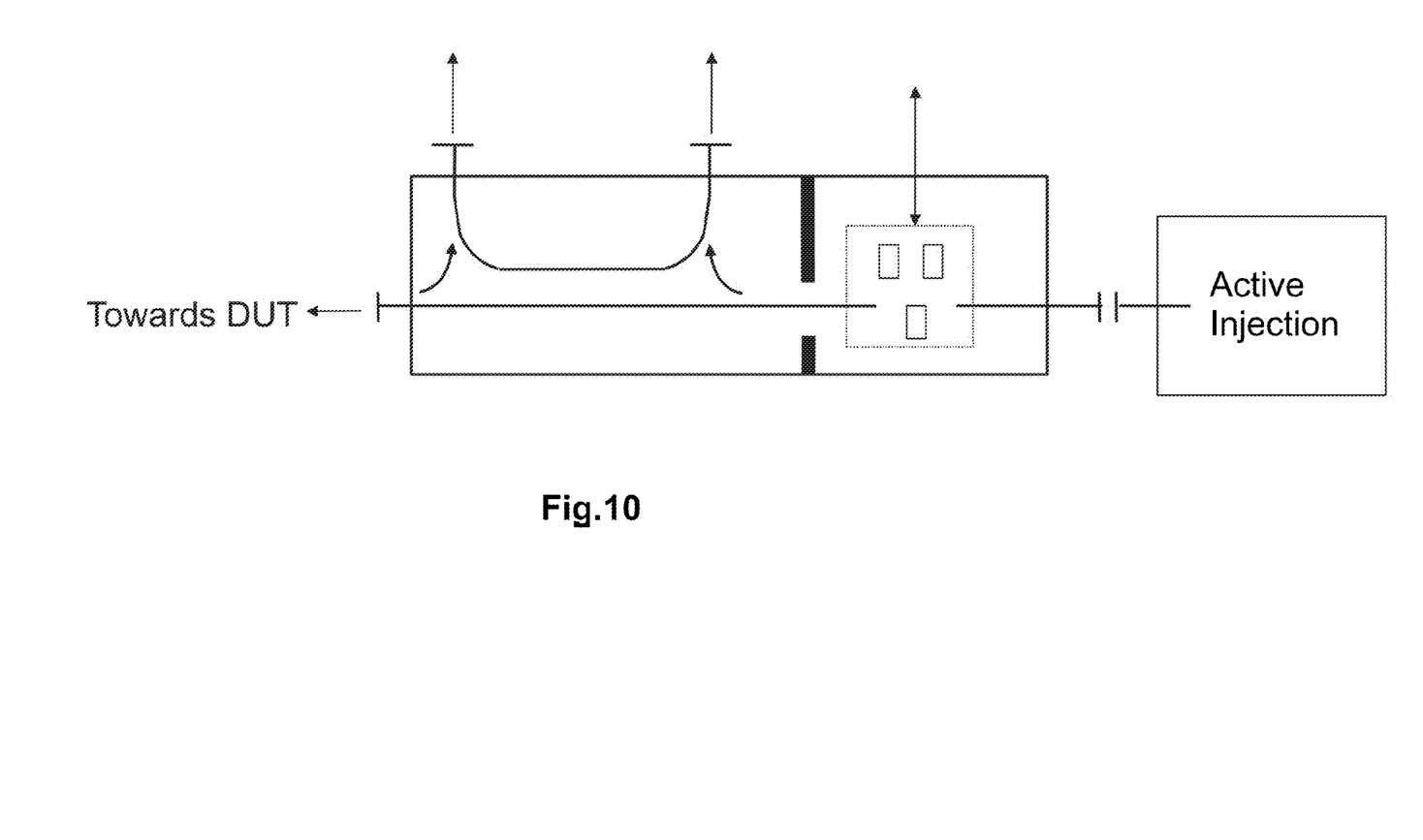
FIG. 10 illustrates a bidirectional coupler extended with chip-based impedance control devices and active injection.

The invention can be extended with one of the active tuning setups as previously described. Likely but not limited to this case, the extension will be done outside the unit that integrates signal separation hardware and impedance control devices (FIG. 10). This allows to set the impedance approximately with the impedance controlled devices and then to fine tune the impedance with the active injection. The active tuning will be used typically to compensate for the losses of the signal separation hardware and possibly some other losses between the tuner and the device under test.

Replacing the couplers inside a vector network analyzer with couplers containing the tuning capability, results in a compact easy to use non-50 Ohm vector network analyzer.

Replacing the coupler inside a vector network analyzer at the input of a DUT with a coupler and integrated tuning chips, allows measuring automatically the noise parameters of a DUT while being able to measure the S-parameters.

Figure 11:
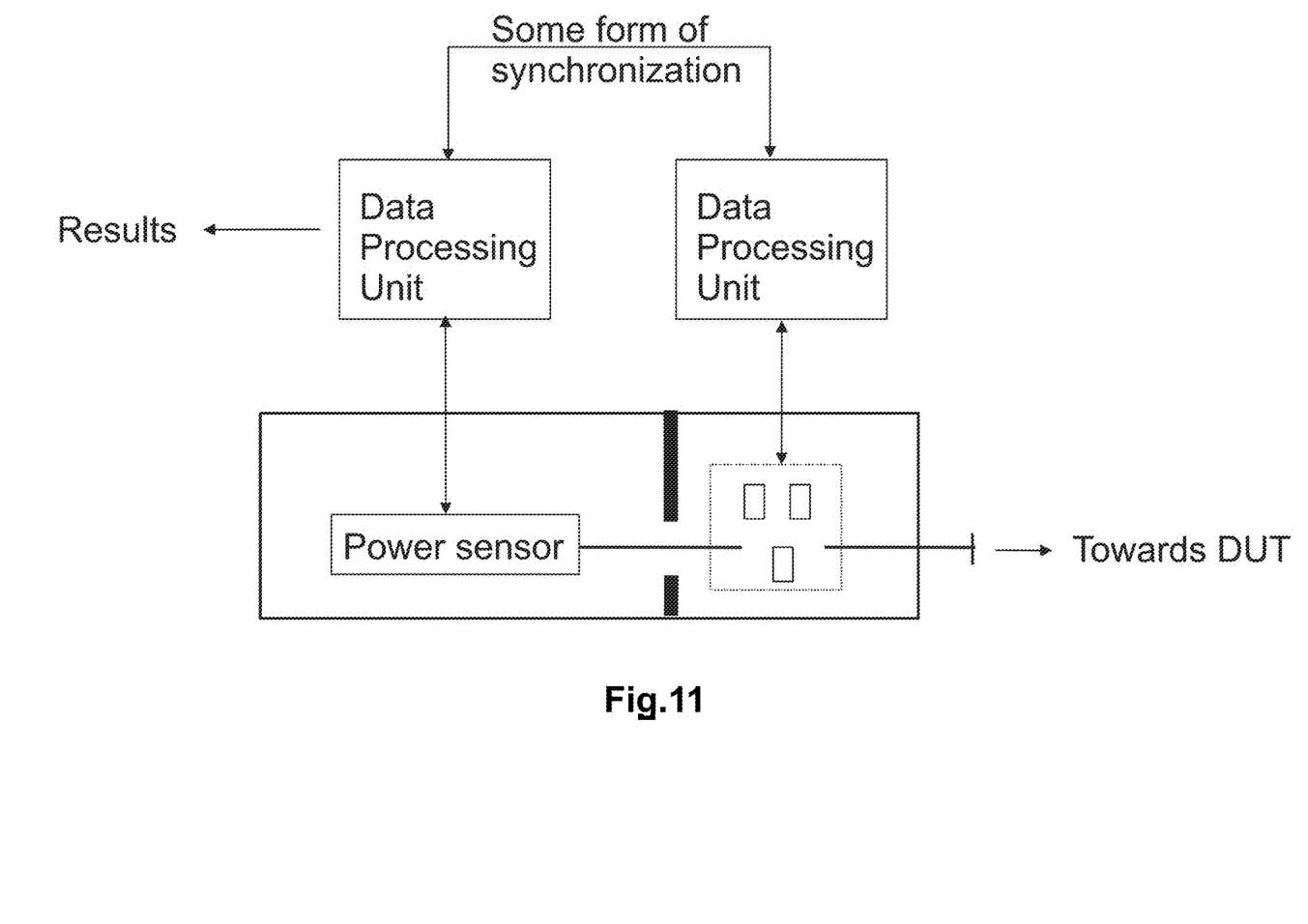
FIG. 11 illustrates a specific embodiment wherein the signal separation hardware is reduced to a through-path.

A special case of the invention exists for the simple load-pull setup (FIG. 1). In this case the signal separation reduces to a signal path from the tuner to the receiver. In one embodiment a specific receiver realization as a power sensor is applied. The innovation then lies in the integration of one or more impedance control devices on a same substrate and integrating them directly with the power sensor circuitry (FIG. 11). As such the power sensor (typically hand-held), foreseen of load-pull functionality in the data processing unit in combination with the power meter functionality, can be used directly to measure power in non-50 Ohm environment (FIG. 11). Possibly power sensor and power meter are integrated. Presently full integrated power meter and sensor units exist as hand-held device foreseen of a USB-connection.

The present invention meaningfully reduces the size and cost of a tuning measurement system and allows integration into test and measurements instruments, such as vector network analyzers, which internally already have couplers as signal separation hardware.

While the invention has been illustrated and described in detail in the drawings and foregoing description, such illustration and description are to be considered illustrative or exemplary and not restrictive. The foregoing description details certain embodiments of the invention. It will be appreciated, however, that no matter how detailed the foregoing appears in text, the invention may be practiced in many ways. The invention is not limited to the disclosed embodiments.

Other variations to the disclosed embodiments can be understood and effected by those skilled in the art in practicing the claimed invention, from a study of the drawings, the disclosure and the appended claims. In the claims, the word "comprising" does not exclude other elements or steps, and the indefinite article "a" or "an" does not exclude a plurality. A single processor or other unit may fulfil the functions of several items recited in the claims. The mere fact that certain measures are recited in mutually different dependent claims does not indicate that a combination of these measures cannot be used to advantage. A computer program may be stored/distributed on a suitable medium, such as an optical storage medium or a solid-state medium supplied together with or as part of other hardware, but may also be distributed in other forms, such as via the Internet or other wired or wireless telecommunication systems. Any reference signs in the claims should not be construed as limiting the scope.

The invention claimed is:

1. A measurement system for characterizing a device under test, DUT, wherein impedance is controlled or varied over a set of measurement conditions and a parameter or a set of parameters measured for each measurement condition, said measurement system comprising:
   at least one impedance control device,
   signal separation hardware connected with said impedance control device,
   receiving means connected with the signal separation hardware for measuring electrical quantities related to characteristics of said DUT and for converting said measured electrical quantities,
   a data processing unit connected to said receiving means and adapted to provide characteristics of said device under test based on said converted electrical quantities,
   whereby said at least one impedance control device is integrated inside said signal separation hardware, wherein a distance from the at least one impedance control device to the DUT—when the DUT is coupled to the measurement system—is shorter than a wavelength of at least one signal used in measuring the electrical quantities.

2. The measurement system for characterizing a DUT as in claim 1, comprising a plurality of said impedance control devices, with one or more of said impedance control devices in a single chip package.

3. The measurement system for characterizing a DUT as in claim 1, wherein said signal separation hardware and said at least one impedance control device are integrated on a common substrate.

4. The measurement system for characterizing a DUT as in claim 3, wherein also said DUT is integrated on said common substrate.

5. The measurement system for characterizing a DUT as in any of the previous claims comprising a further data processing unit connected to said at least one impedance control device and arranged to synthesize a given impedance.

6. The measurement system for characterizing a DUT as in claim 5, wherein said further data processing unit is integrated with said at least one impedance control device.

7. The measurement system for characterizing a DUT as in claim 1, wherein said receiving means is integrated with said signal separation hardware.

8. The measurement system for characterizing a DUT as in claim 7, wherein said data processing unit adapted to provide characteristics of said DUT is integrated with said signal separation hardware.

9. The measurement system for characterizing a DUT as in claim 7, wherein said signal separation hardware is a single signal path from said at least one impedance control device to said receiving means.

10. The measurement system for characterizing a DUT as in claim 1 further comprising means for tuning impedances, said means for tuning at least comprising a signal source.

11. The measurement system for characterizing a DUT as in claim 10, wherein said means for tuning is integrated with either said signal separation hardware or with said at least one impedance control device.

12. The measurement system for characterizing a DUT as in claim 1, wherein said receiver means is a power sensor.

13. The measurement system for characterizing a DUT as in claim 12, wherein said data processing unit is adapted for acting as a power meter.

14. A vector network analyzer comprising a measurement system as in claim 1.

15. A measurement system for characterizing a device under test, DUT, wherein impedance is controlled or varied over a set of measurement conditions and a parameter or a set of parameters measured for each measurement condition, the measurement system comprising
   at least one impedance control device,
   signal separation hardware connected with said impedance control device,
   a receiver connected with the signal separation hardware for measuring electrical quantities related to characteristics of said DUT and for converting said measured electrical quantities,
   a data processing unit connected to said receiver and adapted to provide characteristics of said device under test based on said converted electrical quantities,
   wherein the at least one impedance control device is integrated inside the signal separation hardware, wherein a distance from the at least one impedance control device to the DUT—when the DUT is coupled to the measurement system—is shorter than a wavelength of at least one signal used in measuring the electrical quantities.

* * * * *